(12) United States Patent
Kim et al.

(10) Patent No.: US 8,379,704 B2
(45) Date of Patent: Feb. 19, 2013

(54) METHOD AND DEVICE FOR DATA PROCESSING AND COMMUNICATION SYSTEM WITH DATA PROCESSING DEVICE

(75) Inventors: Jee Hyun Kim, Munich (DE); Wolfgang Zirwas, Munich (DE)

(73) Assignee: Nokia Siemens Networks GmbH & Co. KG, Munich (DE)

( * ) Notice: Subject to any disclaimer, the term of this patent is extended or adjusted under 35 U.S.C. 154(b) by 1010 days.

(21) Appl. No.: 12/270,512

(22) Filed: Nov. 13, 2008

(65) Prior Publication Data
US 2009/0122851 A1 May 14, 2009

(30) Foreign Application Priority Data
Nov. 13, 2007 (EP) .................................. 07022037

(51) Int. Cl.
*H04B 3/46* (2006.01)
(52) U.S. Cl. ........................................ 375/226
(58) Field of Classification Search .................. None
See application file for complete search history.

(56) References Cited

U.S. PATENT DOCUMENTS

| 4,414,675 | A | * | 11/1983 | Comroe ........................ 375/274 |
| 5,420,593 | A | * | 5/1995 | Niles ........................ 342/357.63 |
| 6,072,841 | A | | 6/2000 | Rahnema |
| 2002/0159539 | A1 | * | 10/2002 | Alcock et al. ................. 375/279 |
| 2007/0115799 | A1 | | 5/2007 | Ting et al. |
| 2008/0118006 | A1 | * | 5/2008 | Krishnan et al. .............. 375/324 |
| 2008/0205499 | A1 | * | 8/2008 | Ridel et al. .................... 375/222 |

FOREIGN PATENT DOCUMENTS
WO 03/041354 A1 5/2003

OTHER PUBLICATIONS

J.M. Tribolet; "A New Phase Unwrapping Algorithm"; IEEE Transactions on Acoustics, Speech and Signal Processing, vol. 25, No. 2, Apr. 1977, pp. 170-177.
M. Ansari et al.; "Unified MIMO Pre-Coding based on Givens rotation"; IEEE C802.16E Broadband Wireless Access Working Group; Apr. 2004; pp. 1-11.
J.C. Roh et al.; "An Efficient Feedback Method for MIMO Systems with Slowly Time-Varying Channels"; Proceedings of the IEEE Wireless Communications and Networking Conference, vol. 2, Mar. 2004, pp. 760-764.

* cited by examiner

*Primary Examiner* — Leon-Viet Nguyen
(74) *Attorney, Agent, or Firm* — Staas & Halsey LLP (57) ABSTRACT

Signal processing and/or signal modulation includes tracking a phase parameter; determining a discontinuity; and compensating for the discontinuity.

21 Claims, 8 Drawing Sheets

METHOD AND DEVICE FOR DATA PROCESSING AND COMMUNICATION SYSTEM WITH DATA PROCESSING DEVICE

CROSS REFERENCE TO RELATED APPLICATIONS

This application is based on and hereby claims priority to European Application No. 07022037 filed on Nov. 13, 2007, the contents of which are hereby incorporated by reference.

BACKGROUND

A Givens rotation based matrix decomposition method has been proposed as a way of building a Multiple-Input-Multiple-Output (MIMO) preceding matrix for IEEE 802.16e Mobile WirelessMAN standard (see IEEE C802.16e-04/516, Nortel Networks: Unified MIMO Pre-Coding based on Givens Rotation, 4 Nov. 2004 or J. C. Roh and B. D. Rao, "An Efficient Feed-back Method for MIMO Systems with Slowly Time-Varying Channels", Proc. of IEEE Wireless Communications and Networking Conference (WCNC) 2004, Atlanta, Ga., March 2004).

For a singular value decomposition (SVD) based MIMO preceding technique, the mobile station (MS) is required to send a beam-forming matrix V to the base station (BS). Based on the unitary structure of the matrix V, the number of required parameters to represent V can be greatly reduced by utilizing Givens decomposition method.

For example, $V \in C^{t \times n}$ consists of tn complex numbers, which means it has 2tn real numbers as its elements. By using Givens decomposition, V can be represented by $(2t-1)-n^2$ real numbers.

The Givens parameters can be further quantized by using a 1 bit scalar adaptive delta modulation (ADM) to allow further reduction of the redundancy in a time and/or frequency domain.

The ADM encoder quantizes the difference between a newly incoming sample and a previously quantized sample into 1 bit information. The ADM approach is designed to trace a slowly varying signal, but it is vulnerable to abrupt changes of the signal.

A channel decomposition method and the corresponding Givens parameter extraction method can be found in Roh and Rao's article cited above.

The ADM is an efficient scheme to track the correlated signal utilizing a limited resource. Tracking the Givens parameters, which are angular values, apparently is an appropriate method since they have bounded values, e.g., phase $\phi \in (-\pi, \pi]$, and rotational angle $\theta \in [0, \pi/2)$ (see Roh and Rao's article cited above), and as there exists correlation over time or frequency (in case of a multi-carrier transmission scheme like OFDM).

However, observation of progress of the phase value $\phi$ reveals the fact that there are discontinuities when the phase value $\phi$ approaches a border ($\pi$ or $-\pi$). The phase value $\phi$ disappears at a certain point and promptly re-appears on the other side of the border. This behavior stems from the fact that $\pi$ and $-\pi$ are equivalent in terms of an angular value.

However, such effect bears the problem that even with a slowly varying signal, the bounded value representing it into a scalar can show abrupt changes, which may fail the effort of the ADM encoder to appropriately encode the signal differences.

This cyclic overflow, which is caused by the modular feature of the phase value $\theta = \theta + 2\pi n$, where $\theta \in (-\pi, +\pi]$ and n is integer, should be taken into account when designing an ADM encoder and/or decoder in case of tracing the phase value $\phi$ of the Givens parameters.

Figure 1:
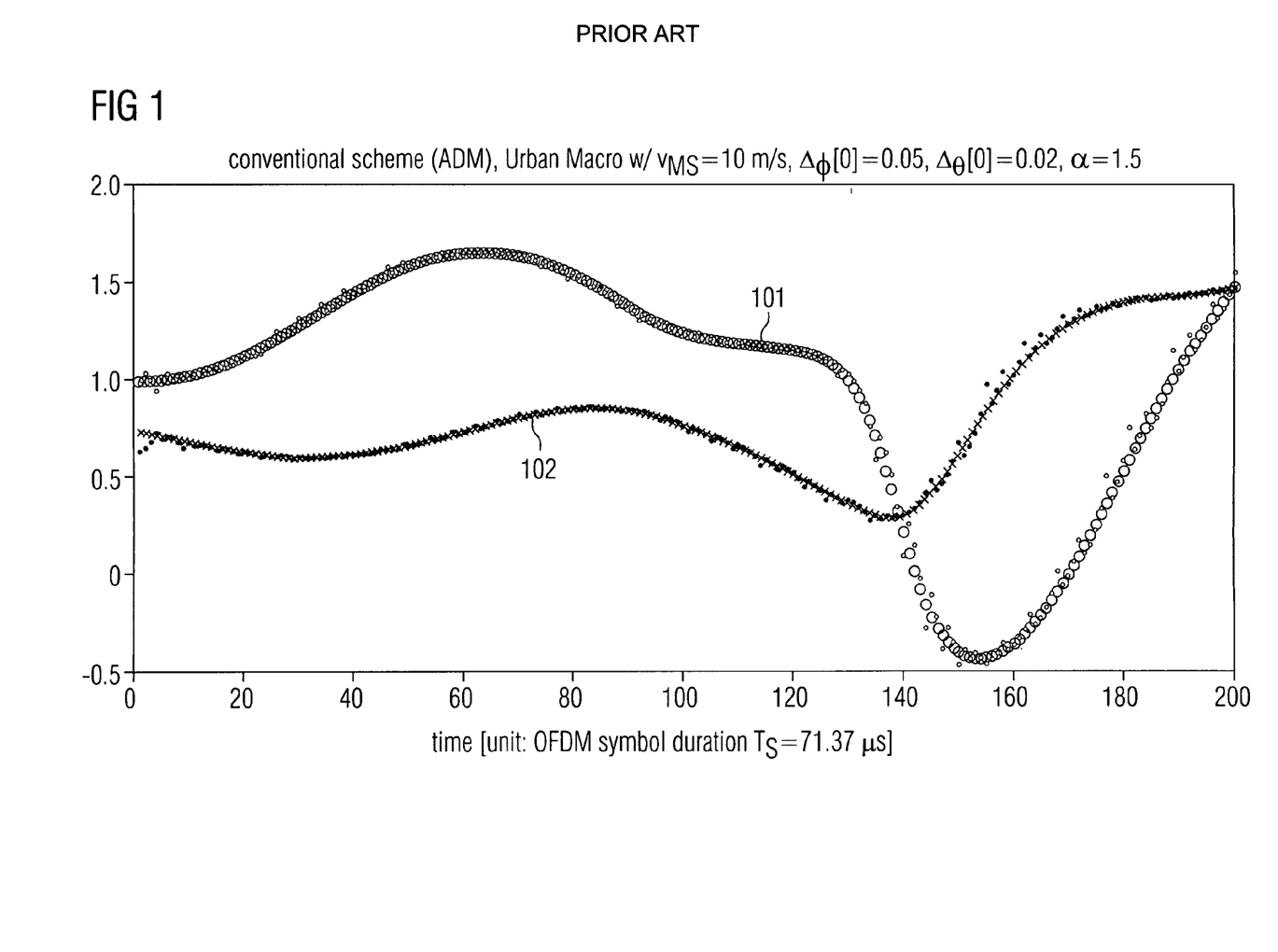
FIGS. 1 and 2 are graphs of the typical behavior of the phase value $\phi$ and the rotational angle $\theta$ over time, for continuous phase values $\phi$ and for discontinuous phase values $\phi$, respectively.
Figure 2:
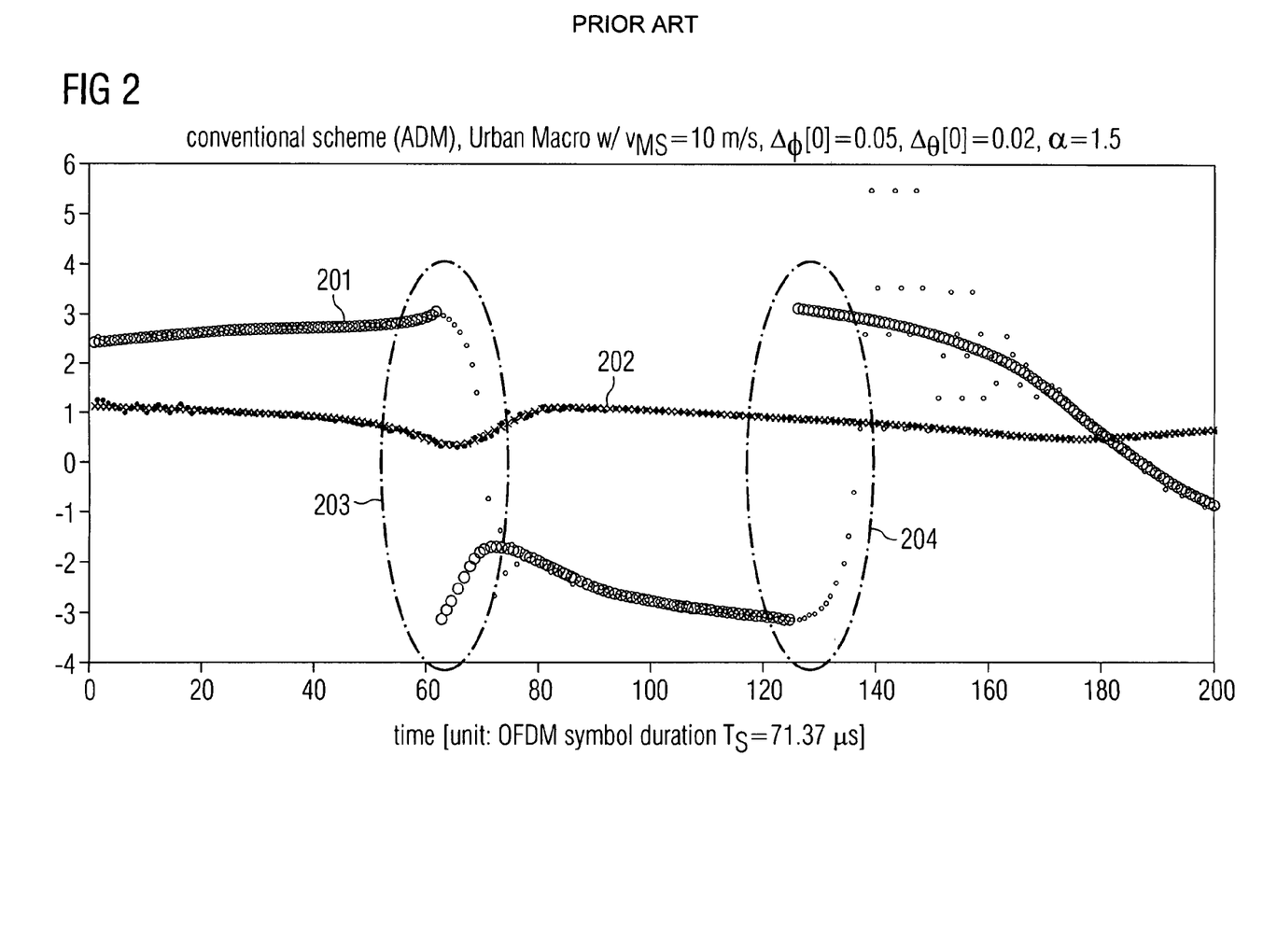

FIG. 1 and FIG. 2 show the typical behavior of the phase value $\phi$ and the rotational angle $\theta$ over time, for continuous phase values $\phi$ and for discontinuous phase values $\phi$, respectively.

Input phase values $\phi$ 101, 201 and rotational angles $\theta$ 102, 202 are acquired by extracting Givens parameters in decomposing a right unitary matrix of a 2×1 MISO channel.

Urban Macro channel realizations, which are generated by an extended spatial channel model (SCMe), are used for simulation purposes. The MS speed is exemplary set to 10 m/s.

In case of tracking the rotational angle $\theta$, which varies continuously within a range $[0, \pi/2)$, the known ADM scheme is good enough to trace the input signal. Such is the case for continuously varying phase value $\phi$ according to FIG. 1.

In case of tracking the phase value $\phi$ in the presence of discontinuities 203, 204 according to FIG. 2, the known scheme loses track of the signal whenever a discontinuity 203 or 204 occurs, and it leads to fluctuations after this point. The tracking concept needs a considerable time to re-trace the input signal. Hence, system performance deteriorates due to the cyclic overflow event.

The adaptive delta modulation (ADM) is widely used to quantize a slowly varying scalar value. In slowly time-varying channels, the corresponding Givens parameters are also slowly and mostly continuously changing, which makes the ADM eligible to quantize Givens parameters.

An ADM encoder includes an accumulator and a one-bit quantizer. The working principle of ADM is described in M. A. Aldajani and A. H. Sayed, "A Stable Structure for Delta Modulation with Improved Performance", Proc. of ICASSP, Salt Lake City, Utah, May. 2001.

A signal $\hat{\phi}[k]$ may be constructed that tracks a signal $\phi[k]$. This can be achieved according to the following approach: At each instant of time, a start value $\hat{\phi}[k-1]$ is updated to $\hat{\phi}[k]$ so that this new value is closer to $\phi[k]$ than its previous value. Each update is based on the difference (or error) between $\phi[k]$ and $\hat{\phi}[k-1]$, defined by $$e_\alpha[k] = \phi[k] - \hat{\phi}[k-1]. \tag{1}$$

The signal $\hat{\phi}[k-1]$ is increased or decreased by a positive amount $\Delta[k]$ depending on an encoder's output history and on a sign of the error (1).

A step-size $\Delta[k]$ of the one-bit quantizer is adaptively changing in order to better track the dynamics of the signal. The step-size is increased if two subsequently encoded bits are the same, and it is decreased otherwise, that is, $$\Delta[k] = \begin{cases} \alpha \Delta[k-1] & \text{if } c[k] = c[k-1] \\ \frac{1}{\alpha} \Delta[k-1] & \text{if } c[k] \neq c[k-1] \end{cases} \tag{2}$$

with
  $\Delta[k]$ being the step-size;
  $c[k] = \text{sign}[e_\alpha[k]] \in \{-1, +1\}$ being an encoded bit for the k-th sample;
  $\alpha$ being a system parameter, which satisfies $\alpha > 1$.

The sign of the error $e_\alpha[k]$ according to (1), decides whether $\hat{\phi}[k-1]$ increases or decreases at each time instant.

Thus, the signal $\hat{\phi}[k]$ is varied according to an adaptation rule:

$$\hat{\phi}[k] = \hat{\phi}[k-1] + \text{sign}[e_\alpha[k]] \Delta[k]. \tag{3}$$

Observing the step-size $\Delta[k]$ reveals the following equivalent form.

$$\Delta[k] = \alpha^{w[k]} \Delta[0] \tag{4}$$

with $$w[k] = w[k-1] + q[k] \tag{5}$$

and $$q[k] = c[k]c[k-1]. \tag{6}$$

Figure 3:
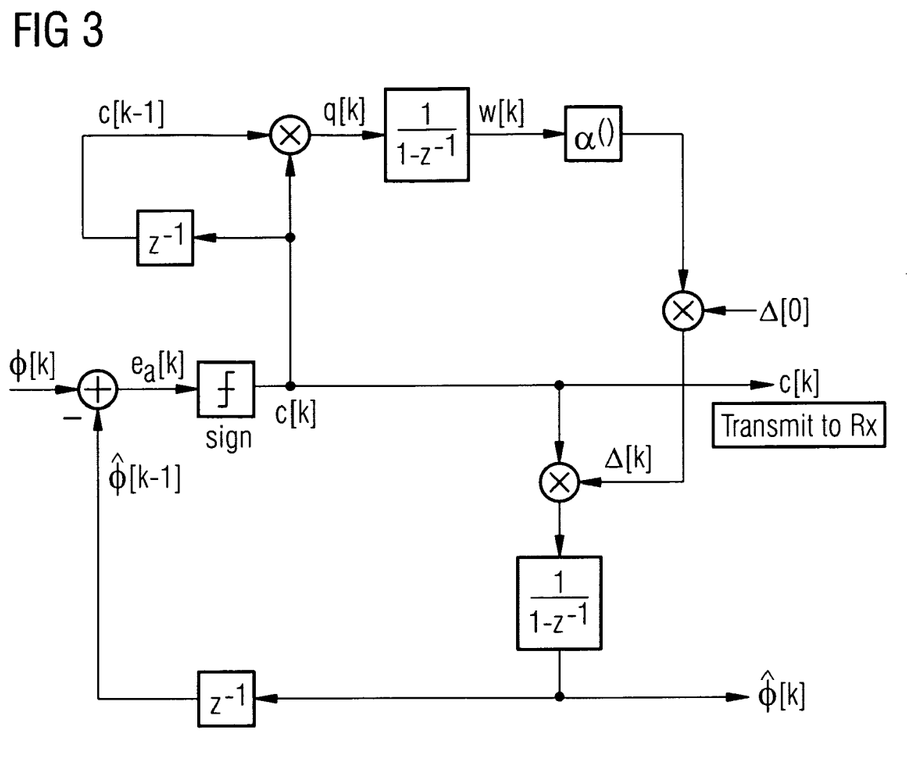
FIG. 3 is a block diagram of a known ADM encoder.

This alternative representation allows describing the scheme for updating $\hat{\phi}[k]$ in a block diagram according to FIG. 3 thereby depicting a known ADM encoder. The upper and lower parts of the figure implement equations (4) and (3), respectively.

It is to be noted that system parameters $\alpha$ and $\Delta[k]$ are known to the ADM encoder as well as to an ADM decoder, and only the encoded bit $c[k]$ is required for the receiver to decode the quantized value $\hat{\phi}[k]$.

The ADM is a low-rate scalar quantization scheme (as low as one bit per parameter), and it has inherently a channel tracking feature for slowly varying channels.

The disadvantages of this method, however, are as follows: The ADM is an appropriate scheme to trace a slowly varying signal, but in case of abrupt transitions as expected with the phase value $\phi$, it is likely to lose track of an incoming signal, in particular to fluctuate. In addition, the known ADM approach requires a considerable amount of time to re-trace the signal (see FIG. 2).

A difference between the actual phase $\phi$ and its quantized value $\hat{\phi}$ may be determined in terms of an average angular distortion (AAD):

$$\overline{e}_\phi = \mathbb{E}[e_\phi] = \frac{1}{N_s} \sum_i^{N_s} \min(|\hat{\phi}_i - \phi_i|, |2\pi - |\hat{\phi}_i - \phi_i||) \tag{7}$$

where $N_s$ is the number of samples taken for the average value calculation.

The AAD value $\overline{e}_\phi$ of a known ADM encoder with $\alpha=1.5$ and $\Delta[0]=0.05$ taken for $N_s=60{,}000$ samples amounts to 0.2409, in case of an Urban Macro channel with an assumed speed of the mobile station (MS) amounting to 10 m/s.

The problem to be solved is to overcome the disadvantages as stated before and in particular to provide an efficient approach as how to handle cyclic overflow events.

To overcome this problem, a method is provided for data processing, in particular for signal processing and/or for signal modulation, that includes:
 tracking a phase parameter;
 determining a discontinuity; and
 compensating for the discontinuity.

This approach advantageously allows in particular an adaptive delta modulation (ADM) encoder to handle a cyclic overflow event when tracking the phase value $\phi$ that is in particular one of the Givens parameters that is advantageously utilized for tracing a MIMO channel over time and/or frequency.

SUMMARY

In an embodiment, the method utilizes an adaptive delta modulator.

In another embodiment, the discontinuity is based on an overflow event, in particular on a cyclic overflow event.

In a further embodiment, the phase parameter includes at least one Givens parameter.

In a next embodiment, the discontinuity is compensated by subtracting or adding $2\pi$ from a recently quantized value.

It is also an embodiment that the discontinuity is determined by a trend condition. The trend condition may advantageously determine whether a value has been increasing or decreasing within a predetermined number of samples.

Pursuant to another embodiment, the discontinuity is determined by a drop and/or by a jump condition.

The drop and/or by the jump condition may each determine whether a difference between a current value and a preceding value is larger than $R\pi$.

It is noted that R may be a value that is close to $2$ ($R=2-\epsilon$, where $\epsilon$ is a small number which satisfies $\epsilon>0$).

According to an embodiment, a flag signal indicates the discontinuity, in particular it indicates a cyclic overflow mode.

According to another embodiment, the method is used by an encoder, in particular by an ADM encoder.

In yet another embodiment, the method is used for signal processing and/or for modulating a signal, in particular according to an adaptive delta modulation scheme.

The problem stated above is also solved by a method for data processing that includes compensating a discontinuity of a phase parameter received based on a flag signal.

This approach advantageously allows in particular an adaptive delta modulation (ADM) decoder to handle a cyclic overflow event when tracking the phase value $\phi$ that is in particular one of the Givens parameters that is advantageously utilized for tracing a MIMO channel over time and/or frequency.

As an embodiment, the flag signal indicates a cyclic overflow mode.

In particular, the flag signal is provided by the encoder as described herein or by a transmitter that includes the encoder.

According to a next embodiment, the discontinuity is compensated by subtracting or adding $2\pi$ from a recently quantized value.

Pursuant to yet another embodiment the method is used by a receiver

The problem stated above is also solved by a device for data processing having a processor unit that is equipped and/or arranged such that the method as described herein is executable on the processor unit.

According to an embodiment, the device is a communication device.

According to yet another embodiment, the device is an encoder or it is associated with an encoder.

Accordingly, the device may be a decoder or it may be associated with a decoder.

The problem stated supra is further solved by a communication system that includes the device as described herein.

BRIEF DESCRIPTION OF THE DRAWINGS

These and other aspects and advantages will become more apparent and more readily appreciated from the following description of the exemplary embodiments, taken in conjunction with the accompanying drawings of which.

DETAILED DESCRIPTION OF THE EXEMPLARY EMBODIMENTS

Reference will now be made in detail to the exemplary embodiments, examples of which are illustrated in the accompanying drawings, wherein like reference numerals refer to like elements throughout.

The approach provided herewith in particular allows the transmitter to detect a cyclic overflow and to take appropriate action so that the receiver side is able to trace the signal.

Figures 4A, 4B, 4C:
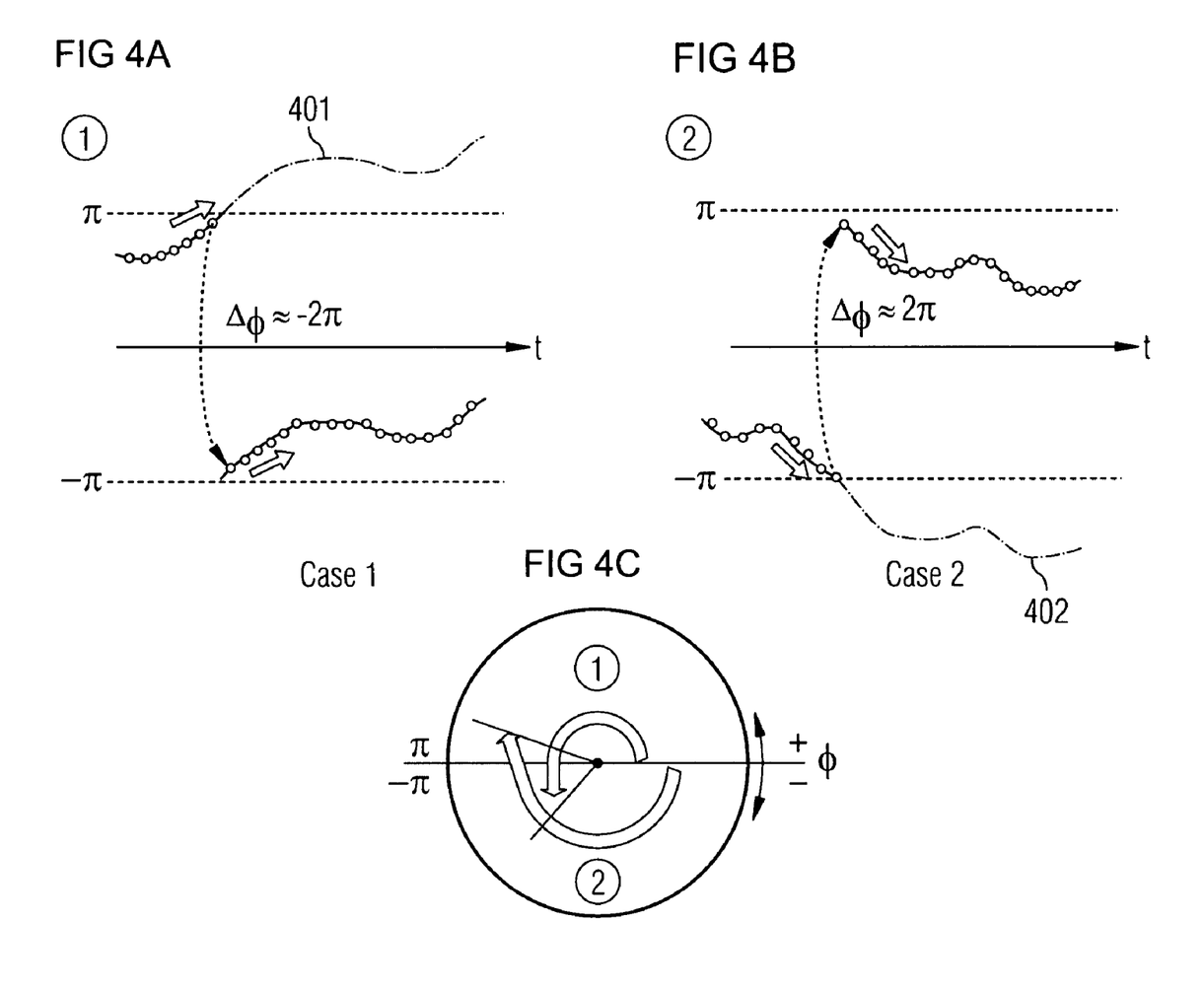
FIG. 4A is a graph of a cyclic overflow case study for Case 1 depicting a $-2\pi$ discontinuity.
FIG. 4B is a graph of a cyclic overflow case study for Case 2 depicting a $2\pi$ discontinuity of a phase value $\phi$.
FIG. 4C is a graph of the cyclic overflow of Case 1 and Case 2.

A cyclic overflow case study is depicted in FIG. 4. Cyclic overflow can be classified in two cases:

The first case (Case 1 in FIG. 4) happens when the phase value $\phi$ increases up to $\pi$ and overflows into the negative region, starting from near $-\pi$ value and keeps increasing.

The second case (Case 2 in FIG. 4) occurs when the phase value $\phi$ decreases down to $-\pi$ and overflows into the positive region, starting from near $\pi$ value and keeps decreasing.

In both cases, a phase difference $|\Delta_\phi|$ is close to $2\pi$ at the point when the cyclic overflow happens. It is to be noted that even though it appears to be discontinuous at cyclic overflow points, its value is actually varying smoothly in terms of effective angular value. This is illustrated in FIG. 4. The dash-lined ghost graphs 401 and 402 are equivalent versions of $(-\pi,\pi]$ bounded graphs.

As the value changes slowly, it is eligible for the ADM scheme as long as it is able to handle the cyclic overflow events.

Herein an approach is suggested that takes into account a cyclic overflow detection scheme. In a normal mode, a ADM encoder and/or decoder may work as the known ADM. However, when a cyclic overflow is detected, the ADM encoder and/or decoder works in a cyclic overflow (CO) mode.

An overall operation in the CO mode is summarized below, and it will be explained in detail hereinafter. The approach provided may in particular be referred to as an adaptive delta modulation with a cyclic overflow detection unit (ADMw-CODU).

Transmitter (ADMwCOSDU Encoder) Operation a) Cyclic Overflow Detection

A cyclic overflow detection unit (CODU) monitors the phase value behavior and detects a cyclic overflow event. The CODU in particular checks the following two conditions:

(Condition A) Recent trend condition:
Does the value have been increasing/decreasing for a number of n last samples?

(Condition B) Sudden drop/jump condition:
Does the current value show a sudden drop/jump of which the difference $|\Delta_\phi|$ is as big as $2\pi$, or in a more precise way, bigger than $R\pi$?

The CODU detection criteria parameters, n and R, may be system parameters. Hence, if the recent trend condition shows that the trend is increasing (denoted as $A^+$, a decreasing case is denoted as $A^-$) and the sudden drop/jump condition indicates that it shows a sudden drop bigger than $R\pi$ ($B^+$, for a sudden jump case: $B^-$), a decision can be made that a cyclic overflow of Case 1 type is detected, and vice versa for the detection of CO of Case 2 type.

In short, the CODU operation can be formulated as follows:

$$D = A^+ B^+ + A^- B^-, \qquad (8)$$

which can be interpreted as $$\text{OR}(\text{AND}(A^+, B^+), \text{AND}(A^-, B^-)).$$

Checking these conditions, the transmitter may advantageously use actual signal values $\phi$ rather than its quantized value $\hat{\phi}$ in an effort to increase the detection accuracy.

b) Cyclic Overflow Mode Encoder Operation

The encoder takes an appropriate action once a cyclic overflow is detected. One major action is to make a transition from $\pi$ to $-\pi$ by subtracting $2\pi$ from the most recent quantized value $\hat{\phi}[k-1]$ in Case 1. In Case 2, the transition from $-\pi$ to $\pi$ takes place by adding $2\pi$.

The encoder may generate a Flag signal and the transmitter is supposed to send it to the receiver together with an encoded bit $c[k]$, so as to indicate that it is in the cyclic overflow (CO) mode.

In the CO mode the ADMwCODU may require more feedback information than in normal mode, but this burden still is minimal since CO mode may happen less than 3 times in 300 OFDM symbols (symbol duration $T_s$=71.37 μs) for a speed of the mobile station amounting to 10 m/s.

Mostly, the transmitter does not have to send the Flag signal as the CO mode is much less frequent than the normal mode and the Flag signal may be sent only if cyclic overflow is detected.

Therefore, ADMwCODU significantly improves the performance compared to a known ADM.

It is to be noted that the encoding bit information $c[k]$ could be misleading if interpreted as defined in the known ADM ($c[k]=\text{sign}[e_\alpha([k]]=\text{sign}[\phi[k]-\hat{\phi}[k-1]])$, since its value does not take into account any cyclic overflow effect. For example, the value of $c[k]$ is $-1$ (i.e., "decreasing") in Case 1, but its actual trend is increasing. Therefore, the encoder operation may have to consider this fact when dealing with the encoding bit information $c[k]$ value. The step-size $\Delta[k]$ may be handled likewise, since it relates to the encoding bit information $c[k]$ according to equation (2).

Receiver (ADMwCODU Decoder) Operation a) Cyclic Overflow Detection

The receiver detects the cyclic overflow by receiving the Flag signal conveyed by the transmitter. The Flag signal may be sent only when the encoder detects the cyclic overflow, therefore it arrives at the receiver non-periodically, and therefore not very often.

b) Cyclic Overflow Mode Decoder Operation

The decoder takes an appropriate action when a cyclic overflow detection is reported. It may perform a $2\pi$ subtraction/addition in the same way as it is done by the encoder.

Utilizing the Flag signal, the decoder is able to trace the signal even when abrupt changes due to the cyclic overflow occur. Regarding the values for the step size Δ[k], the corresponding operation, which works as a counter part of the encoder operation, may advantageously be processed in CO mode at the decoding (receiving) side.

Implementation and Advantages

As explained, the approach (ADMwCODU) works in two modes: In the normal (default) mode, it operates similar or the same as the known ADM encoder/decoder. In cyclic overflow (CO) mode, the ADMwCODU detects a CO event and switches to an operation which is designed to handle the CO event.

ADMwCODU Encoder Operation

Figure 5:
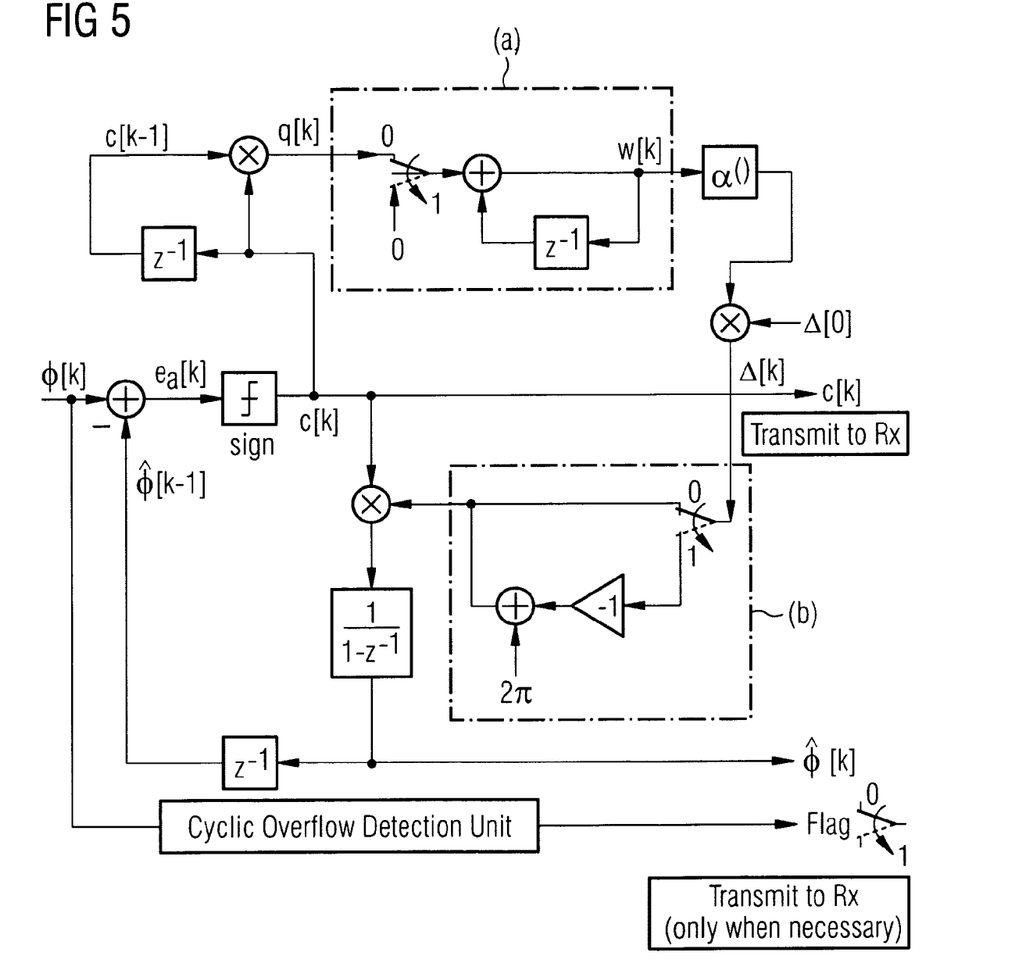
FIG. 5 is a block diagram of an adaptive delta modulation (ADM) encoder having a cyclic overflow detection unit (CODU) providing a Flag signal to a receiver.

The block diagram of the proposed ADMwCODU encoder is depicted in FIG. 5 with a cyclic overflow detection unit (CODU) and associated blocks (a) and (b).

The CODU takes a phase signal φ[k] as an input and produces a Flag signal when it detects a cyclic overflow (CO) event.

When the Flag signal is ON ("1"), corresponding cyclic overflow mode encoder operations are performed in blocks (a) and (b), and the Flag signal is sent to the transmitter together with the encoded 1 bit signal c[k]. When the Flag signal is OFF ("0"), the encoder operates in normal mode and produces the encoded 1 bit signal only.

Cyclic Overflow Detection

The CODU monitors the phase signal and detects a CO event based on the detection criterion (8).

Figure 6:
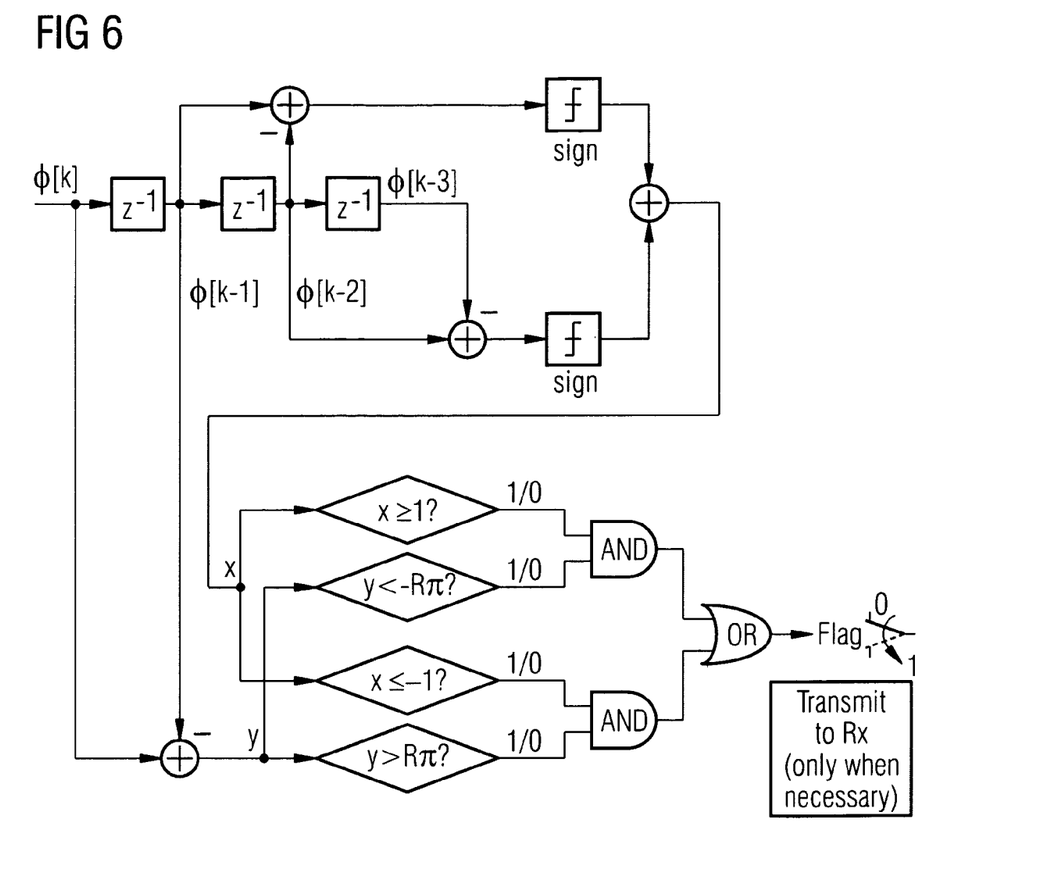
FIG. 6 is a block diagram of the cyclic overflow detection unit (CODU), in particular depicting as how the Flag signal to be conveyed to the receiver is generated.

A block diagram of the CODU is shown in FIG. 6. There are two different conditions that may be implemented as follows:

1. (Condition A) Recent Trend Condition:
In this case, n=3 is assumed, which means that a trend for the last three samples is traced.
The differences between adjacent two samples over time are taken and two difference values which are φ[k−1]−φ[k−2] and φ[k−2]−φ[k−3] are acquired, respectively.
If at least one of these two difference values is positive and the other is non-negative, its trend is deemed INCREASING. If at least one of two values is negative and the other is non-positive, its trend is deemed DECREASING.
This can be formulated as follows.

$$\text{condition}(A) = \begin{cases} A^+ & \text{if } x \geq 1 \\ A^- & \text{if } x \leq -1 \end{cases}, \quad (9)$$

where $$x = \text{sign}(\phi[k-1]-\phi[k-2]) + \text{sign}(\phi[k-2]-\phi[k-3]),$$

which is also shown in FIG. 6.

2. (Condition B) Sudden Drop/Jump Condition
This condition can be realized by determining a difference between the current input and the most recent input and by evaluating if its value is greater (smaller) than a certain criterion Rπ (−Rπ), wherein R is a value close to 2 (R=2−ε, where ε>0):

$$\text{condition}(B) = \begin{cases} B^+ & \text{if } y \leq -R\pi \\ B^- & \text{if } y \geq R\pi \end{cases}, \quad (10)$$

where y=φ[k]−φ[k−1].

Based on the results of conditions A and B, the Flag signal can be written as $$\text{Flag} = A^+B^+ + A^-B^-. \quad (11)$$

in logic equation form.

Cyclic Overflow Mode Encoder Operation

CO mode encoder operations are performed in largely two parts, which are depicted by dashed line blocks (a) and (b) in FIG. 5.

It is to be noted that in normal (default) mode with the Flag signal value being "0", the encoder operates the same or similar as the known scheme and in particular with the Flag set to "1", the alternative mode is processed that may include in particular the following:

1. Take a previous value for the step size Δ[k] and discard a present value.
   As explained above, the c[k] value, if calculated in the known scheme, is contradictory to the actual trend in terms of angular value. So is Δ[k].
   According to the approach presented herein, the current value may be discarded and a most recent previous value is taken as step size Δ[k].
   This can be formulated as:

$$\Delta[k] = \Delta[k-1]. \quad (12)$$

In Block (a), w[k]=w[k−1] is provided to the next phase, and as a result, equation (12) is met.

2. 2π transition is included when calculating the quantized value $\hat{\phi}[k]$.
   A transition may be performed from π to −π (or from −π to π) so as to trace the input signal taking into account the cyclic overflow effect.
   This operation is performed by forwarding 2π−Δ[k] instead of Δ[k] in Block (b). Hence, equation (3) becomes:

$$\hat{\phi}[k] = \hat{\phi}[k-1] + c[k](2\pi - \Delta[k]). \quad (13)$$

It is to be noted that the value of the step size Δ[k] may be obtained after block (a) operation has been carried out, while the c[k] value contradicts the actual trend.

For example, when c[k]=−1(φ[k]<$\hat{\phi}$[k−1]) as Case 1 in FIG. 4, the current trend is INCREASING, contrary to what the c[k] value suggests. This is the reason why the minus sign is put in front of the step size Δ[k].

ADMwCODU Decoder Operation

Figures 7A, 7B:
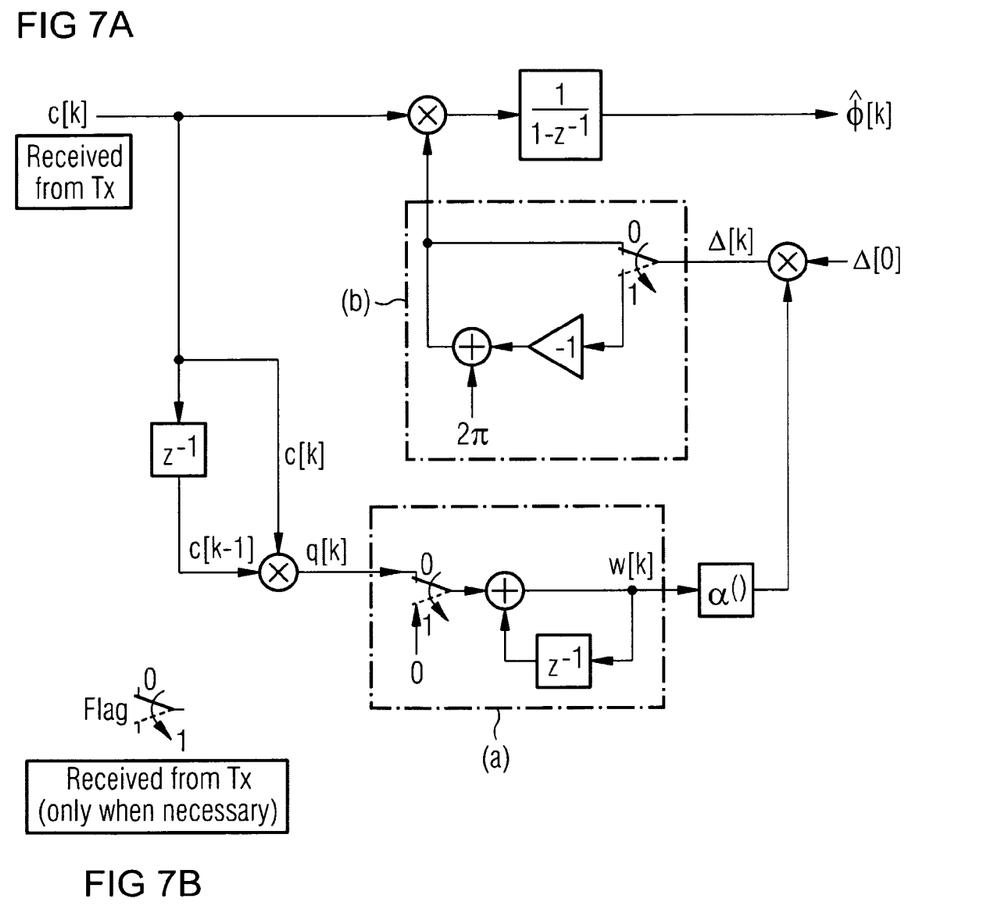
FIG. 7A is a block diagram of an adaptive delta modulation (ADM) decoder having two different modes, i.e. a normal mode and a cyclic overflow mode that is activated by the Flag signal received from the encoder.
FIG. 7B is a graph illustrating a flag received from the transmitter.

An ADMwCODU decoder block diagram is depicted in FIG. 7. According to the ADMwCODU encoder, in normal mode the ADMwCODU decoder operates as the known ADM decoder, in particular as long as there is no Flag signal.

In CO mode (i.e., when the Flag signal is received), cyclic overflow mode decoder operations are performed by blocks (a) and (b), which correspond to the blocks (a) and (b) of FIG. 5.

The ADMwCODU decoder is able to construct the quantized signal $\hat{\phi}[k]$ only by the one bit encoded signal c[k] and, on occasion, by the Flag signal.

Further Advantages

The proposed ADMwCODU scheme shows a significantly tracking capability improvement when it comes to quantization of the phase value φ of Givens parameters compared to the known ADM approach.

Figure 8:
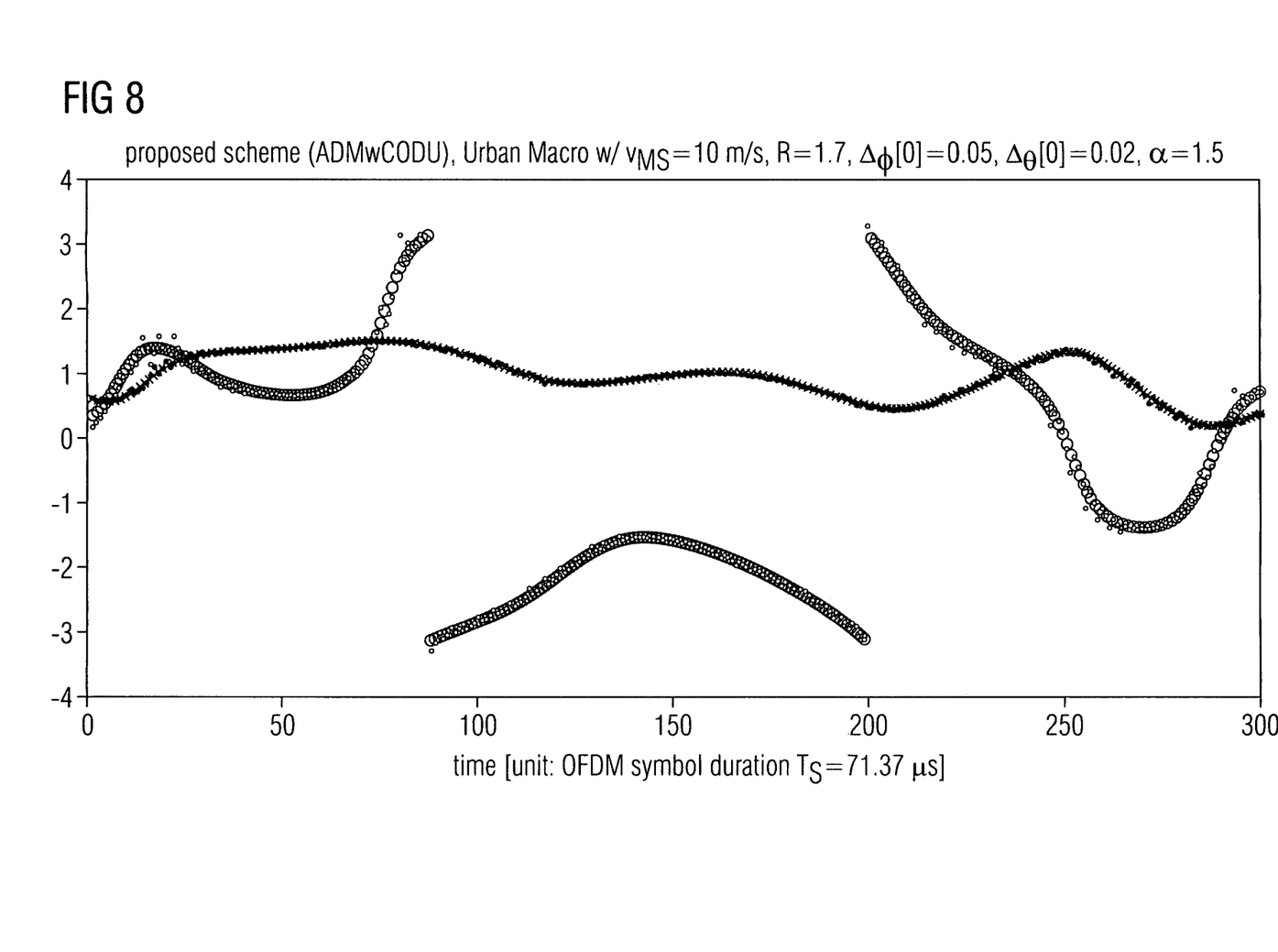
FIG. 8 is a graph illustrating behavior of an adaptive delta modulation with a cyclic overflow detection unit (ADMw-CODU) output of the phase value $\phi$ and the rotational angle $\theta$ over time.

The signal and its tracking results are shown in FIG. 8. The average angular distortion (AAD) value $\bar{e}_\phi$ taken for 60,000 samples is 0.0731, which is about 30.3% of that of the known scheme (0.2409). In other words, ADMwCODU outperforms ADM by more than 3.3 times in terms of the AAD value.

FIG. 8 shows that the ADMwCODU approach is capable of tracking discontinuous phase values $\phi$ and continuous rotational angle values $\theta$. In the example of FIG. 8 the cyclic overflow (CO) happens on average 1.6 times over 300 OFDM symbols in case of the mobile speed $v_{MS}$=10 m/s, which requires 1.6 more bit feedback overhead compared with the known scheme during 300 OFDM symbol time. This corresponds to minimal cost compared to a huge performance improvement.

ADMwCODU can be used to trace slowly varying phase values which may suffer from cyclic overflow events. One possible application scenario is to quantize and trace the phase value, which is one of Givens parameters, provided that it has correlation over time or frequency. Givens parameters in this case are assumed to be fed back from a mobile station (MS) to a base station (BS) in an effort to facilitate channel-aware precoding and scheduling from the base station side. The channel information can be reconstructed by using Givens decomposition method, with Givens parameters provided. Time correlation can be exploited when tracking the channel over time, while frequency correlation allows encoding the difference between sub-carriers with one bit feedback, in case of an OFDM based system. ADMwCODU basically only needs one bit for encoding the delta information between adjacent time/frequency, and requires one extra bit only when there occurs a cyclic overflow event, which is rather seldom.

The overall system performance, however, can be greatly improved with small extra cost, e.g., additional hardware unit for detecting cyclic overflow events (CODU), and the rarely transmitted Flag signal.

The system also includes permanent or removable storage, such as magnetic and optical discs, RAM, ROM, etc. on which the process and data structures of the present invention can be stored and distributed. The processes can also be distributed via, for example, downloading over a network such as the Internet. The system can output the results to a display device, printer, readily accessible memory or another computer on a network.

A description has been provided with particular reference to exemplary embodiments thereof and examples, but it will be understood that variations and modifications can be effected within the spirit and scope of the claims which may include the phrase "at least one of A, B and C" as an alternative expression that means one or more of A, B and C may be used, contrary to the holding in Superguide v. DIRECTV, 358 F3d 870, 69 USPQ2d 1865 (Fed. Cir. 2004).

The invention is claimed is:

1. A method for data processing, comprising:
    tracking, by a processor in a data processing system, a phase parameter;
    determining a discontinuity in operation of the data processing system based on a drop and/or a jump condition, and a trend condition indicating whether a phase value has been increasing or decreasing within a predetermined number of samples to produce a difference substantially larger than $2\pi$ between a current phase value and a preceding phase value; and
    compensating for the discontinuity.

2. The method according to claim 1, wherein the method utilizes an adaptive delta modulator.

3. The method according to claim 2, wherein the discontinuity is based on an cyclic overflow event.

4. The method according to claim 3, wherein the phase parameter includes at least one Givens parameter.

5. The method according to claim 4, wherein said compensating for the discontinuity includes subtracting or adding $2\pi$ from a recently quantized value.

6. The method according to claim 5, wherein a flag signal indicates the discontinuity in a cyclic overflow mode.

7. The method according to claim 6, an encoder performs said tracking, determining and compensating.

8. The method according to claim 7, wherein the data processing includes signal processing and/or modulating a signal.

9. A method for data processing comprising:
    compensating for a discontinuity of a drop and/or a jump condition of a phase parameter received, based on a flag signal, and a trend condition indicating whether a phase value has been increasing or decreasing within a predetermined number of samples to produce a difference substantially larger than $2\pi$ between a current phase value and a preceding phase value.

10. The method according to claim 9, wherein the flag signal indicates a cyclic overflow mode.

11. The method according to claim 10, wherein said compensating for the discontinuity includes subtracting or adding $2\pi$ from a recently quantized value.

12. The method according to claim 11, a receiver performs said compensating.

13. A device for data processing, comprising:
    a processor programmed to perform operations including tracking a phase parameter, determining a discontinuity in the phase parameter based on a drop and/or a jump condition, and a trend condition indicating whether a phase value has been increasing or decreasing within a predetermined number of samples to produce a difference substantially larger than $2\pi$ between a current phase value and a preceding phase value, and compensating for the discontinuity.

14. The device according to claim 13, wherein the device is a communication device.

15. The device according to claim 13, wherein the device is an encoder.

16. The device according to claim 13, wherein the device is associated with an encoder.

17. The device according to claim 13, wherein the device is a decoder.

18. The device according to claim 13, wherein the device is associated with a decoder.

19. A communication system, comprising:
    a device having a processor programmed to perform operations including tracking a phase parameter, determining a discontinuity in the phase parameter based on a drop and/or a jump condition, and a trend condition indicating whether a phase value has been increasing or decreasing within a predetermined number of samples to produce a difference substantially larger than 2π between a current phase value and a preceding phase value, and compensating for the discontinuity.

20. A device for data processing, comprising:

a processor programmed to perform operations including compensating for a discontinuity of a drop and/or a jump condition of a phase parameter received, based on a flag signal, and a trend condition indicating whether a phase value that has been increasing or decreasing within a predetermined number of samples to produce a difference substantially larger than 2π between a current phase value and a preceding phase value.

21. A communication system, comprising:

a device having a processor programmed to perform operations including compensating for a discontinuity of a drop and/or a jump condition of a phase parameter received, based on a flag signal, and a trend condition indicating whether a phase value has been increasing or decreasing within a predetermined number of samples to produce a difference substantially larger than 2π between a current phase value and a preceding phase value.

\* \* \* \* \*

UNITED STATES PATENT AND TRADEMARK OFFICE
CERTIFICATE OF CORRECTION

PATENT NO. : 8,379,704 B2
APPLICATION NO. : 12/270512
DATED : February 19, 2013
INVENTOR(S) : Jee Hyun Kim et al.

It is certified that error appears in the above-identified patent and that said Letters Patent is hereby corrected as shown below:

In the Claims

Column 10, Line 7, In Claim 3, delete "on an a" and insert -- on a --, therefor.

Signed and Sealed this
Fourteenth Day of May, 2013

Teresa Stanek Rea
*Acting Director of the United States Patent and Trademark Office*